(12) United States Patent
Kim

(10) Patent No.: US 7,795,805 B2
(45) Date of Patent: Sep. 14, 2010

(54) ORGANIC LIGHT EMITTING DEVICE AND METHOD OF MANUFACTURING THE SAME

(75) Inventor: Sung Hee Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 666 days.

(21) Appl. No.: 11/802,538

(22) Filed: May 23, 2007

(65) Prior Publication Data

US 2008/0001531 A1    Jan. 3, 2008

(30) Foreign Application Priority Data

Jun. 20, 2006  (KR) ........................ 10-2006-055239
May 11, 2007  (KR) ........................ 10-2007-046037

(51) Int. Cl.
 *H01L 51/54* (2006.01)

(52) U.S. Cl. ...................................... 313/504; 428/690

(58) Field of Classification Search .......... 313/500–512
See application file for complete search history.

(56) References Cited

U.S. PATENT DOCUMENTS 6,620,529 B1 * 9/2003 Ise et al. .................... 428/690
2004/0232437 A1 * 11/2004 Sakai et al. ................ 257/103

* cited by examiner

*Primary Examiner*—Nimeshkumar D Patel
*Assistant Examiner*—Mary Ellen Bowman
(74) *Attorney, Agent, or Firm*—Morgan Lewis & Bockius LLP

(57) ABSTRACT

An organic light emitting device includes a first electrode for providing holes, a second electrode facing the first electrode and providing electrons, an organic luminescent layer interposed between the first and second electrodes, and an electron transfer layer disposed between the second electrode and the organic luminescent layer, wherein the electron transfer layer is a single layer including electron transfer members so that the electron transfer layer injects and transports electrons to the organic luminescent layer while preventing holes from the first electrode from flowing into the electron transfer layer.

19 Claims, 9 Drawing Sheets

ORGANIC LIGHT EMITTING DEVICE AND METHOD OF MANUFACTURING THE SAME

This invention claims the benefit of Korean Patent Application No. 10-2006-055239 filed in Korea on Jun. 20, 2006, and Korean Patent Application No. 10-2007-046037 filed in Korea on May 11, 2007, which are hereby incorporated by reference in their entirety.

BACKGROUND OF THE INVENTION

1. Field of the Invention

Embodiments of the present invention relate to a light emitting device, and more particularly, to an organic light emitting device and a method of manufacturing the same. Although embodiments of the invention are suitable for a wide scope of applications, it is particularly suitable for achieving a small device thickness, improving sharpness of an image, and simplifying a manufacturing process.

2. Description of the Related Art

Information processing equipment (IPE), and a display device that displays data of an electrical signal processed in the IPE in the form of an image has been developed. An example of a representative display device includes a liquid crystal display device, an organic light emitting device, or a plasma display panel. The liquid crystal display device displays an image using a liquid crystal, the organic light emitting device displays an image using an organic luminescent material, and the plasma display panel displays an image using a plasma. These display devices are mainly used for the IPE, such as computers, notebook computers, watches, mobile phones, MP3 players, or television receiver sets.

The organic light emitting device that displays an image using the organic luminescent material does not require a light supply unit, such as a backlight, and thus has a significantly small volume and weight. More specifically, the organic light emitting device includes a pair of conductive electrodes, and an organic luminescent layer interposed between the conductive electrodes. The organic luminescent layer includes an organic luminescent material. When a forward current is applied to the conductive electrodes of the organic light emitting device, light is generated from the organic luminescent layer. However, the related art organic light emitting device has problems of a complicated manufacturing process, a long manufacturing time, and a large overall thickness because an electron injection layer (EIL) and an electron transport layer (ETL) are formed on the electrode. Also, if the thicknesses of the electron injection layer and the electron transport layer of the related art organic light emitting device are not uniform, undesired light may be generated, causing image quality to considerably degrade, such as sharpness.

SUMMARY OF THE INVENTION

Accordingly, embodiments of the present invention is directed to an organic light emitting device and a method of manufacturing the same that substantially obviate one or more problems due to limitations and disadvantages of the related art.

An object of embodiments of the invention is to provide a single-layer electron transfer layer for providing electrons to the organic luminescent layer.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an organic light emitting device includes a first electrode for providing holes, a second electrode facing the first electrode and providing electrons, an organic luminescent layer interposed between the first and second electrodes, and an electron transfer layer disposed between the second electrode and the organic luminescent layer, wherein the electron transfer layer is a single layer including electron transfer members so that the electron transfer layer injects and transports electrons to the organic luminescent layer while preventing holes from the first electrode from flowing into the electron transfer layer.

In another aspect, a method of manufacturing an organic light emitting device includes forming a second electrode on a substrate, forming a hole injection layer and a hole transport layer sequentially on the second electrode, forming an organic luminescent layer on the hole transport layer, forming an electron transfer layer, including a plurality of electron transfer members and an insulating layer, on the organic luminescent layer, and forming a first electrode on the electron transfer layer.

In another aspect, a method of manufacturing an organic light emitting device includes forming a first electrode on a substrate, forming an electron transfer layer, including a plurality of electron transfer members and an insulating layer, on the first electrode, forming an organic luminescent layer on the electron transfer layer, forming a hole transport layer a hole injection layer sequentially on the organic luminescent layer, and forming a second electrode on the a hole injection layer.

In yet another aspect, an organic light emitting device includes a first substrate having a display device having a first electrode the first substrate for providing holes, a second electrode facing the first electrode and providing electrons, an organic luminescent layer interposed between the first and second electrodes and an electron transfer layer disposed between the second electrode and the organic luminescent layer, wherein the electron transfer layer is a single layer including single-crystal silicon particles so that the electron transfer layer injects and transports electrons to the organic luminescent layer while preventing holes from the first electrode from flowing into the electron transfer layer, a second substrate having a driving device, and an encapsulating member joining the first and second substrate.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENTS

Reference will now be made in detail to the preferred embodiments of the present invention, examples of which are illustrated in the accompanying drawings. Embodiments of the invention may, however, be embodied in many different forms and should not be construed as being limited to the embodiments set forth herein. In the figures, the dimensions of layers and regions are exaggerated for clarity of illustration. It will also be understood that when a layer (or structure) is referred to as being 'on' or 'under' another layer or structure, it can be directly on or 'under' the other layer or substrate, or intervening layers may also be present. Also, though terms like a first, a second, and a third are used to describe various regions and layers in various embodiments of the present invention, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

Figure 1:
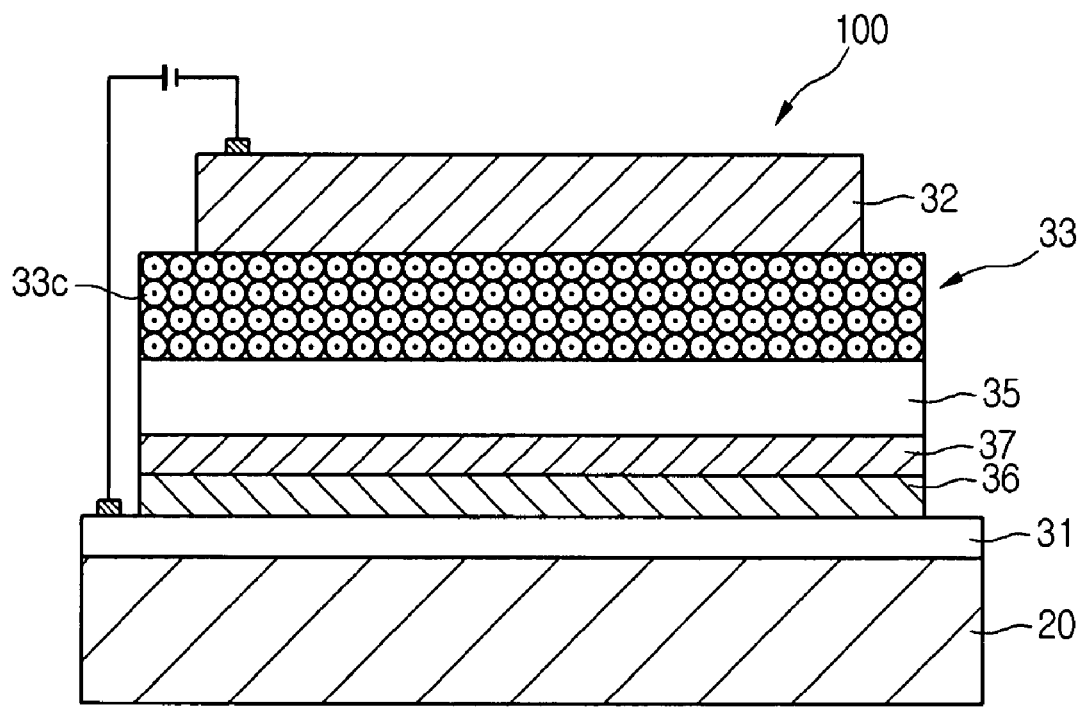
FIG. 1 is a cross-sectional view of an organic light emitting device according to a first embodiment of the present invention.
Figure 2:
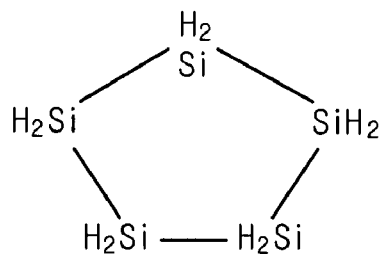
FIG. 2 is a view for describing a process of forming an electron transfer layer of an organic light emitting device according to an embodiment of the present invention.
Figure 2:
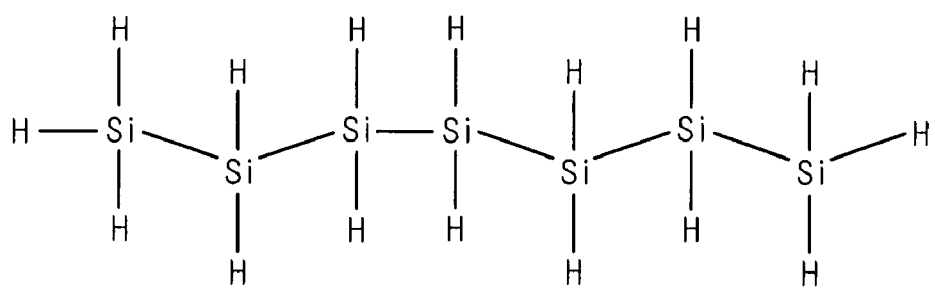
Figure 3:
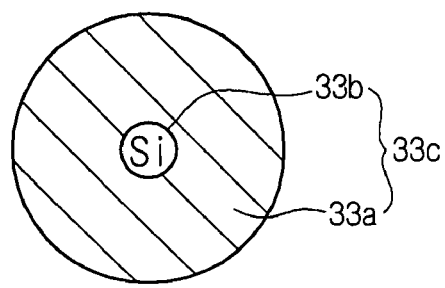
FIG. 3 is a cross-sectional view of an electron transfer member constituting an electron transfer layer of the organic light emitting device of FIG. 1.
Figure 4:
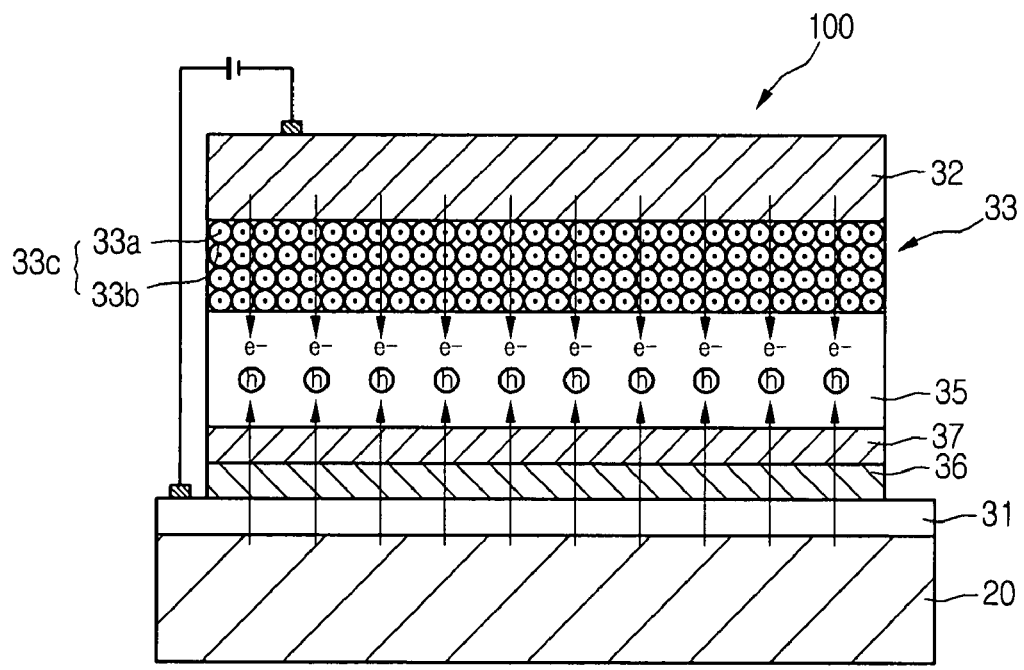
FIG. 4 is a cross-sectional view illustrating holes and electrons provided to an organic luminescent layer in the organic light emitting device of FIG. 1.

FIG. 1 is a cross-sectional view of an organic light emitting device according to a first embodiment of the present invention, and FIG. 2 is a view for describing a process of forming an electron transfer layer of an organic light emitting device according to the first embodiment of the present invention. FIG. 3 is a cross-sectional view of an electron transfer member forming an electron transfer layer of the organic light emitting device of FIG. 1, and FIG. 4 is a cross-sectional view illustrating holes and electrons provided to an organic luminescent layer of the organic light emitting device of FIG. 1.

Referring back to FIG. 1, the organic light emitting device 100 includes a first electrode 31, a second electrode 32, an organic luminescent layer 35, and an electron transfer layer 33. The organic light emitting device 100 can further include a substrate 20, a hole injection layer 36, and a hole transport layer 37. The first electrode 31 is disposed on the substrate 20, and the hole injection layer 36 and the hole transport layer 37 are sequentially disposed on the first electrode 31. The organic luminescent layer 35 is disposed on the hole transport layer 37, and the electron transfer layer 33 is disposed on the organic luminescent layer 35. The substrate 20 can be, for example, a transparent glass substrate.

The first electrode 31 disposed on the transparent substrate 20 can include a transparent conductive material. For example, examples of a material used for the first electrode 31 include indium tin oxide (ITO), indium zinc oxide (IZO) and amorphous indium tin oxide (a-ITO).

The hole injection layer 36 disposed on the first electrode 31 can include, for example, Cu-phthalocyanine (CuPc). Although CuPc is used as an example of a material of the hole injection layer 36 in the current embodiment, various hole transport compounds can be used provided that those compounds serve to transport holes injected from the first electrode 31 to the organic luminescent layer 35. For example, the hole injection layer 36 can include a hole-injectable polypyrine compound, a phthalocyanine compound, a hole-transportable aromatic tertiary amine, a trisphenothiazinyl triphenylamine derivative or a trisphenoxa-dinyltriphenylamine derivative, polythiopene, and a compound including a carbazole group. Alternatively, the hole injection layer 36 can include a triazole compound, an oxadiazole derivative, an imidazole derivative, a polyarylalkan derivative, a pyrazoline derivative, a pyrazolone derivative, a phenylenediamine derivative, an arylamine derivative, an oxazole derivative, a styrylanthracene derivative, a fluorine derivative, a hydrazone derivative, a stylbene derivative, a porphyrin compound, an aromatic tertiary amine compound, a styrylamine compound, a butadiene compound, a polystyrene derivative, a hydrazone derivative, a triphenylmethane derivative, a tetraphenylbenzidine derivative, a polyaniline based polymer material, a polythiophene-based polymer material, or a polypyrrole-based polymer material.

Referring to FIG. 1 again, the hole transport layer 37 is disposed on the hole injection layer 36. The hole transport layer 37 efficiently transports holes provided from the first electrode 31 and the hole injection layer 36 to the organic luminescent layer 35. The organic luminescent layer 35 can be disposed on the hole injection layer 36. Alternatively, the organic luminescent layer 35 can be disposed directly on the first electrode 31. Various polymer materials suited to the generation of red, green, blue light are used for the organic luminescent layer 35.

The second electrode 32 provides electrons toward the organic luminescent layer 35. The electrons provided from the second electrode 32, and the holes provided from the first electrode 31 allow the organic luminescent layer 35 to generate red light, green light, and blue light depending on a polymer material forming the organic luminescent layer 35. A material with a low work function can be used for the second electrode 32, and examples of materials used for the second electrode 32 include aluminum and aluminum alloy. To efficiently transport electrons from the second electrode 32 to the organic luminescent layer 35, the electron transfer layer 33 is formed the second electrode 32 and the organic luminescent layer 35.

Referring to FIG. 3, the electron transfer layer 33 has a single-layered structure. The single-layered electron transfer layer 33 serves as both an electron injection layer and an electron transport layer. The electron transfer layer 33 accelerates and transfers electrons from the second electrode 32 to the organic luminescent layer 35. To inject and transport electrons from the second electrode 32 to the organic luminescent layer 35, the electron transfer layer 33 includes a plurality of electron transfer members 33c. That is, the electron transfer layer 33 includes the electron transfer members 33c so that the electron transfer layer 33 injects and transports electrons to the organic luminescent layer 35 as a single layer.

The electron transfer members 33c include respective single-crystal silicon particles 33b and an insulating layer 33a encompassing each of the single-crystal silicon particles 33b. The electron transfer layer 33 is formed using a binder to provide the plurality of electron transfer members 33c as a thin film. The single-crystal silicon particles 33b can have a diameter ranging from about 50 Å to 100 Å. The insulating layer 33a encompassing the single-crystal silicon particles 33b is, for example, a silicon nitride layer (SiNx) or a silicon oxide layer (SiOx). The electron transfer members 33c, including the single-crystal silicon particles 33b within the insulating layer 33a, are disposed with a uniform thickness between the second electrode 32 and the organic luminescent layer 35.

FIG. 2 is a view for describing a process of forming an electron transfer layer of an organic light emitting device according to an embodiment of the present invention. This method of forming the electron transfer layer 33 starts by radiating ultraviolet (UV) rays having a wavelength in a range of about 395 nanometers to about 415 nanometers onto cyclopentasilane (CPS, SixH2x) to cause a polymerization reaction, as illustrated in FIG. 2. The resulting polymerized material is mixed with a volatile solution. Thereafter, polymerized material solution is coated onto the first electrode 31 or on the organic luminescent layer 35. More specifically, the polymerized material solution can be inkjetted onto the first electrode 31 or on the organic luminescent layer 35. Subsequently, the polymerized material coating is subjected to a heat treatment at about 500 degrees Celsius to about 600 degrees Celsius to form single-crystal silicon particles 33b. Thereafter, an insulating layer 33a is formed on the single-crystal silicon particles 33b by a deposition process to form the electron transfer members 33c of the electron transfer layer 33. The insulating layer 33a can be a silicon nitride layer, a silicon oxide layer or an organic insulating layer. In the alternative, the insulating layer 33a can be deposited by a spin coating process or printing.

Another method of forming the electron transfer layer 33 starts by mixing nano powder type silicon particles with a volatile solution. Then, the silicon particle solution is coated onto the first electrode 31 or on the organic luminescent layer 35. More specifically, the silicon particle solution can be inkjetted onto the first electrode 31 or on the organic luminescent layer 35. Subsequently, the silicon particle coating is subjected to a heat treatment to form single-crystal silicon particles 33b. Thereafter, an insulating layer 33a is formed on the single-crystal silicon particles 33b by a deposition process to form the electron transfer members 33c of the electron transfer layer 33. The insulating layer 33a can be a silicon nitride layer, a silicon oxide layer or an organic insulating layer. In the alternative, the insulating layer 33a can be deposited by a spin coating process or printing.

The thickness of the electron transfer layer 33, including the electron transfer members 33c, measured between the organic luminescent layer 35 and the second electrode 32 can be in a range of about 300 Å to about 600 Å. If the thickness of the electron transfer layer 33 is smaller than about 300 Å, the number of electrons transferred to the organic luminescent layer 35 through the electron transfer layer 33 considerably decrease relative to the number of holes. In contrast, if the thickness of the electron transfer layer 33 is greater than about 600 Å, the number of electrons transferred to the organic luminescent layer 35 through the electron transfer layer 33 increase considerably relative to the number of holes.

Also, if the thickness of the electron transfer layer 33 is greater than about 600 Å, the entire thickness of the organic light emitting device 100 increases.

As illustrated in FIG. 4, the electron transfer layer 33 injects and transports electrons to the organic luminescent layer 35, and prevents holes provided from the first electrode 31 from flowing into the electron transfer layer 33, thereby greatly improving sharpness of an image generated from the organic luminescent layer 35. Since the electron transfer layer 33 for transferring electrons from the second electrode 32 to the organic luminescent layer 35 by accelerating the electrons is formed as a single layer, a manufacturing process of the organic light emitting device 100 can be shortened.

As mentioned above, the single-layered electron transfer layer, including the electron transfer members formed by encompassing each single-crystal silicon particle with an insulating layer, is disposed between the second electrode and the organic luminescent layer. Thus, the manufacturing process of the organic light emitting device, and the time for the manufacturing process are reduced. Also, light generation is prevented from occurring in the electron transfer layer, so that sharpness of an image obtained by light generated by the organic luminescent layer can be greatly improved.

Figure 5:
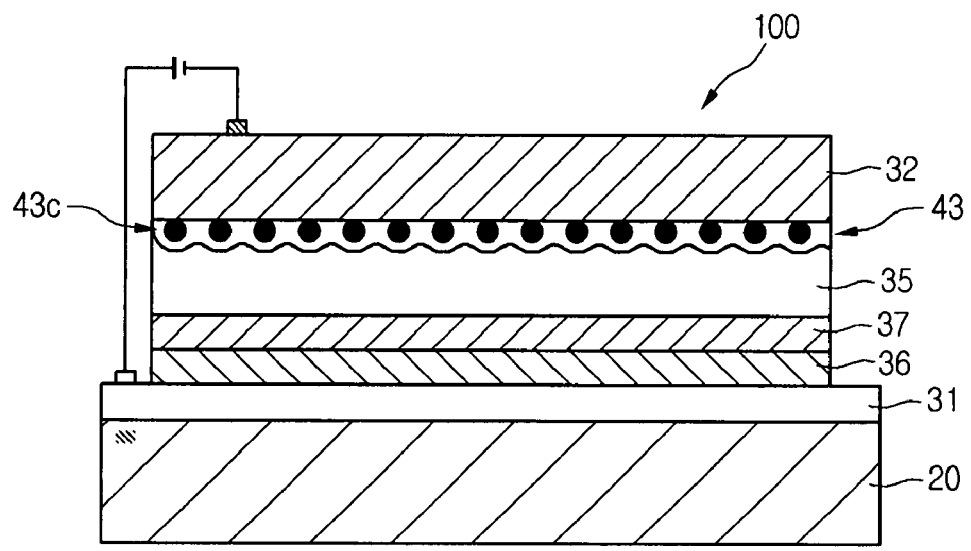
FIG. 5 is a cross-sectional view of an organic light emitting device according to a second embodiment of the present invention.
Figure 6:
FIG. 6 is a cross-sectional view of an electron transfer member constituting an electron transfer layer of the organic light emitting device of FIG. 5.
Figure 7:
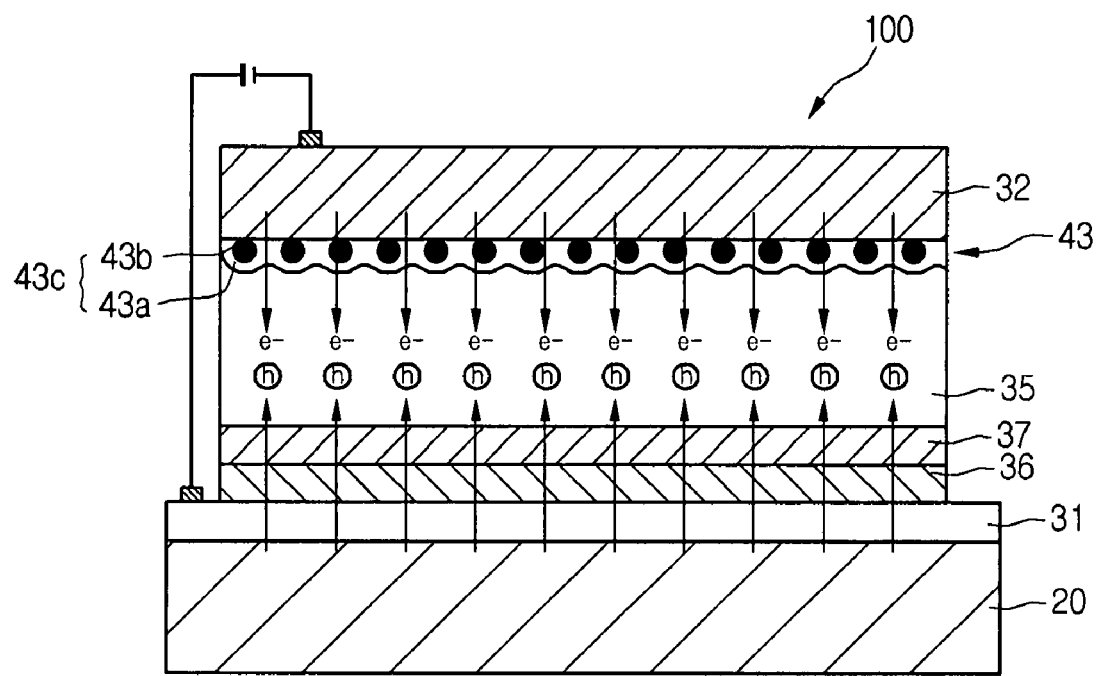
FIG. 7 is a cross-sectional view illustrating holes and electrons provided to an organic luminescent layer of the organic light emitting device of FIG. 5.

FIG. 5 is a cross-sectional view of an organic light emitting device according to a second embodiment of the present invention, FIG. 6 is a cross-sectional view illustrating an electron transfer member forming an electron transfer layer of the organic light emitting device of FIG. 5, and FIG. 7 is a cross-sectional view illustrating holes and electrons provided to an organic luminescent layer of the organic light emitting device of FIG. 5. Referring to FIG. 5, an organic light emitting device 200 according to a second embodiment is structurally similar to the organic light emitting device 100 of FIG. 1, and thus like reference numerals and names are used for like elements of the same materials as those of FIG. 1. Thus, the following description is mainly focused on an electron transfer layer 43, and the detailed descriptions of other elements refer to FIGS. 1 through 4.

The organic light emitting device 200 includes a first electrode 31, a second electrode 32, an organic luminescent layer 35, and an electron transfer layer 43. The organic light emitting device 200 can further include a substrate 20, a hole injection layer 36 and a hole transfer layer 37.

The first electrode 31 is disposed on the substrate 20, and the hole injection layer 36 and the hole transport layer 37 are sequentially disposed on the first electrode 31. The organic luminescent layer 35 is disposed on the hole transport layer 37, and the electron transfer layer 43 is disposed on the organic luminescent layer 35.

As illustrated in FIG. 5, the hole transport layer 37 is disposed on the hole injection layer 36. The hole transport layer 37 efficiently transports holes provided from the first electrode 31 and the hole injection layer 36 to the organic luminescent layer 35. To efficiently transport electrons provided from the second electrode 32 to the organic luminescent layer 35, the electron transfer layer 43 is formed between the second electrode 32 and the organic luminescent layer 35.

Referring to FIG. 7, the electron transfer layer 43 has a single-layered structure. The single-layered electron transfer layer 43 serves as an electron injection layer and an electron transport layer. That is, the electron transfer layer 43 accelerates and transfers electrons from the second electrode 32 to the organic luminescent layer 35. The electron transfer layer 43 includes a plurality of electron transfer members 43c to inject and transport electrons from the second electrode 32 to the organic luminescent layer 35. Since the electron transfer layer 43 includes the electron transfer members 43c, the electron transfer layer 43 can inject and transport electrons to the organic luminescent layer 35 as a single-layered structure.

Each of the electron transfer members 43c is a single-crystal silicon particle 43b in an insulating layer 43a. The single-crystal silicon particle 43b can have a diameter ranging from about 50 Å to 100 Å. Also, the insulating layer 43a can be, for example, a silicon nitride layer (SiNx) or a silicon oxide layer (SiOx). The electron transfer members 43c within the insulating layer 43a are disposed with a uniform thickness between the second electrode 32 and the organic luminescent layer 35.

The thickness of the electron transfer layer 43, including the electron transfer members 43c, measured between the organic luminescent layer 35 and the second electrode 32 can be in a range of about 300 Å to about 600 Å. When the thickness of the electron transfer layer 43 is smaller than about 300 Å, the number of electrons transported to the organic luminescent layer 35 through the electron transfer layer 43 can considerably decrease relative to the number of holes. If the thickness of the electron transfer layer 43 is greater than about 600 Å, the number of electrons transported to the organic luminescent layer 35 through the electron transfer layer 43 can considerably increase relative to the number of holes. Also, if the thickness of the electron transfer layer 43 is greater than about 600 Å, the entire thickness of the organic light emitting device 100 can increase.

As illustrated in FIG. 7, the electron transfer layer 43 according to a second embodiment of the present invention injects and transports electrons to the organic luminescent layer 35, and prevents holes provided from the first electrode 31 from flowing into the electron transfer layer 43, thereby greatly improving sharpness of an image generated from the organic luminescent layer 35. As the electron transfer layer 43 accelerating and transporting electrons provided from the second electrode 32 to the organic luminescent layer 35 is formed as a single layer, a manufacturing process of the organic light emitting device 100 can be reduced.

As mentioned above, the single-layered electron transfer layer including the electron transfer members each formed by deposition of the insulating layer for single-crystal silicon particles disposed between the second electrode and the organic luminescent layer. Thus, the manufacturing process of the organic light emitting device, and the time for the manufacturing process are reduced. Also, light generation is prevented from occurring at the electron transfer layer, so that sharpness of an image formed by light generated by the organic luminescent layer can be greatly improved.

Figure 8A:
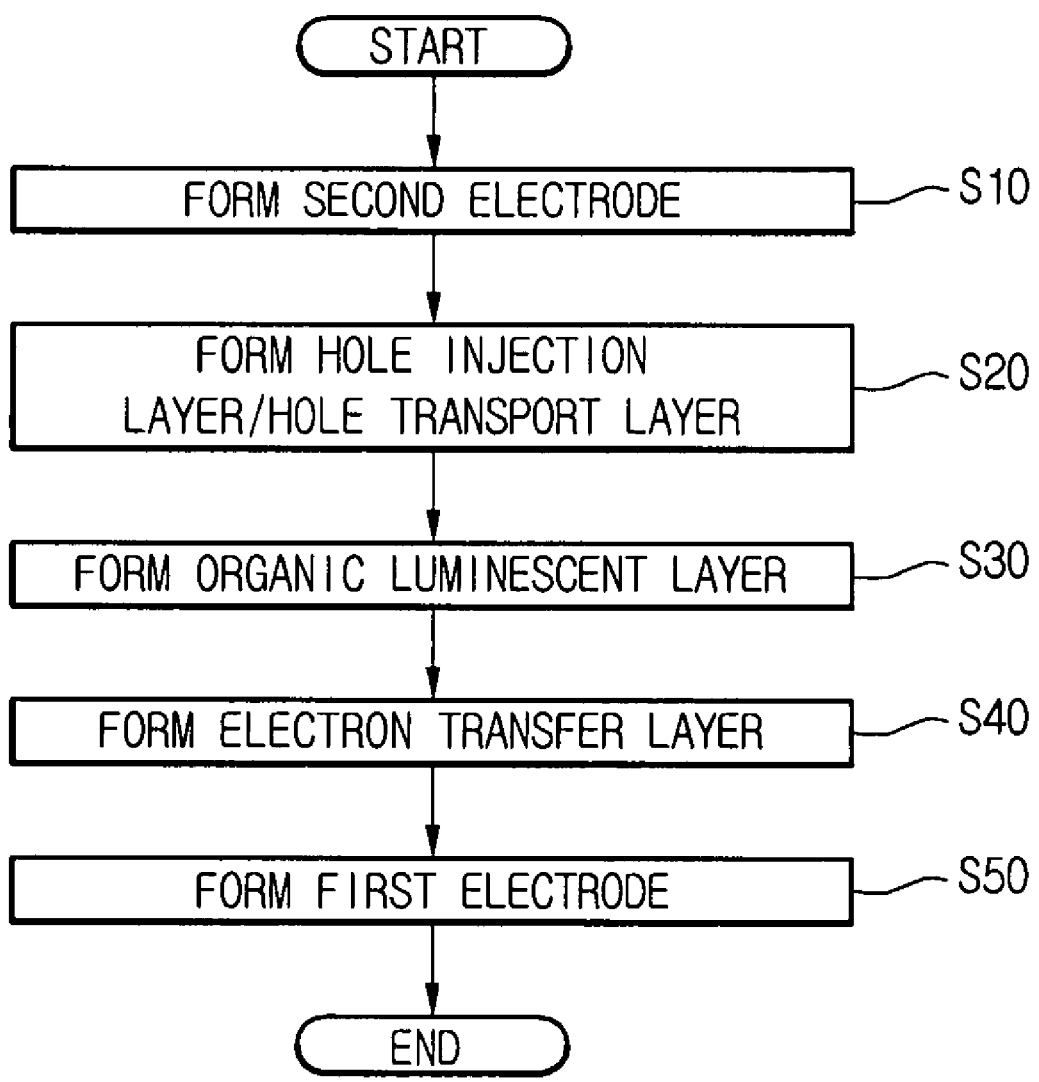
FIG. 8A is a flowchart of a method of manufacturing an organic light emitting device according to a third embodiment of the present invention.

FIG. 8A is a flowchart illustrating a manufacturing method of an organic light emitting device according to a third embodiment of the present invention. Referring to FIGS. 1, 5 and 8A, a manufacturing method of the organic light emitting device will now be described. In step S10, a first electrode 31 is formed on a substrate 20, such as a glass substrate. A transparent conductive layer (not shown) is formed on the substrate 20 to form the first electrode 31. The transparent conductive layer can be formed of, for example, an indium tin oxide (ITO), an indium zinc oxide (IZO), or an amorphous indium tin oxide (a-ITO). A photoresist film is formed on the transparent conductive layer. The photoresist film is patterned by a photo-process, including an exposure process and a development process to form a photoresist pattern on the transparent conductive layer. The transparent conductive layer is patterned using the photoresist pattern as an etch mask to form the first electrode 31 on the substrate 20.

In step S20, a hole injection layer 36 and a hole transport layer 37 are sequentially formed on the first electrode 31. The hole injection layer 36 and the hole transport layer 37 can be formed by a vacuum deposition process.

In step S30, after the hole injection layer 36 and the hole transport layer 37 are formed on the first electrode 31, an organic luminescent layer 35 is formed on the hole transport layer 37. The organic luminescent layer 35 can be formed by a vacuum deposition process. The organic luminescent layer 35 can include a polymer material that can generate red light, green light and blue light by combination of holes provided through the hole injection layer 36 and the hole transport layer 37, and electrons transported by an electron transfer layer to be described later.

In step S40, an electron transfer layer 33(43) is formed on the organic luminescent layer 35. Referring to FIGS. 3 and 6, the electron transfer layer 33(43) includes a plurality of electron transfer members 33c(43c). The electron transfer members 33c(43c) can be formed by coating powder type single-crystal silicon particles 33b(43b), or the single crystal silicon particles 33b(43b) can be formed UV radiation. After the powder type single-crystal silicon particles 33b(43b) are formed, the insulating layer 33a(43a) is formed. The insulating layer 33a(43a) is formed of silicon nitride (SiNx) or silicon oxide (SiOx).

The single-layered electron transfer layer 33(43), including the electron transfer members 33c(43c) with the insulating layer 33a(43a) coating the single-crystal silicon particles 33b(43b), efficiently transports electrons provided from a second electrode 32 to be described later to the organic luminescent layer 35. The electron transfer layer 33(43) is formed by mixing powder type single-crystal silicon particles with a solvent or a volatile solution, and forming a resulting mixture on the organic luminescent layer 35, and then forming the insulating layer 33a(43a) thereon. Alternatively, the electron transfer layer 33(43) is formed by forming single-crystal silicon particles into a thin film using a UV polymerization reaction, and then forming the insulating layer 33a(43a) thereon.

The insulating layer 33a(43a) is formed by depositing a silicon nitride layer or a silicon oxide layer to form the electron transfer members 33c as illustrated FIG. 3, or form the electron transfer members 43c as illustrated in FIG. 6. When the single-crystal silicon particles 33b are formed on the organic luminescent layer 35 and then the insulating layer 33a is formed by a spin coating process, the transfer member 33c, as illustrated in FIG. 3, is formed. Alternatively, when the insulating layer 43a is formed by a deposition process, the transfer member 43c, as illustrated in FIG. 6, is formed. Also, an application and solvent-removing process for applying a mixture, including the electron transfer members 33c(43c), on the organic luminescent layer 35 and forming a preliminary electron transfer layer includes a dry process using a heat treatment. The application process includes providing a mixture of a binder and the electron transfer members 33c(43c) on the organic luminescent layer 35 through a silk screen process, a slit coating process, or a spin coating process.

The thickness of the electron transfer layer 33(43) measured from a surface of the organic luminescent layer 35 can range from about 300 Å to 600 Å. In step S50, after the electron transfer layer 33(43) is formed on the organic luminescent layer 35, a second electrode 32 is formed on the electron transfer layer 33(43). The second electrode 32 can be formed of, for example, aluminum, or aluminum alloy. The second electrode 32 provides electrons to the electron transfer layer 33(43).

Figure 8B:
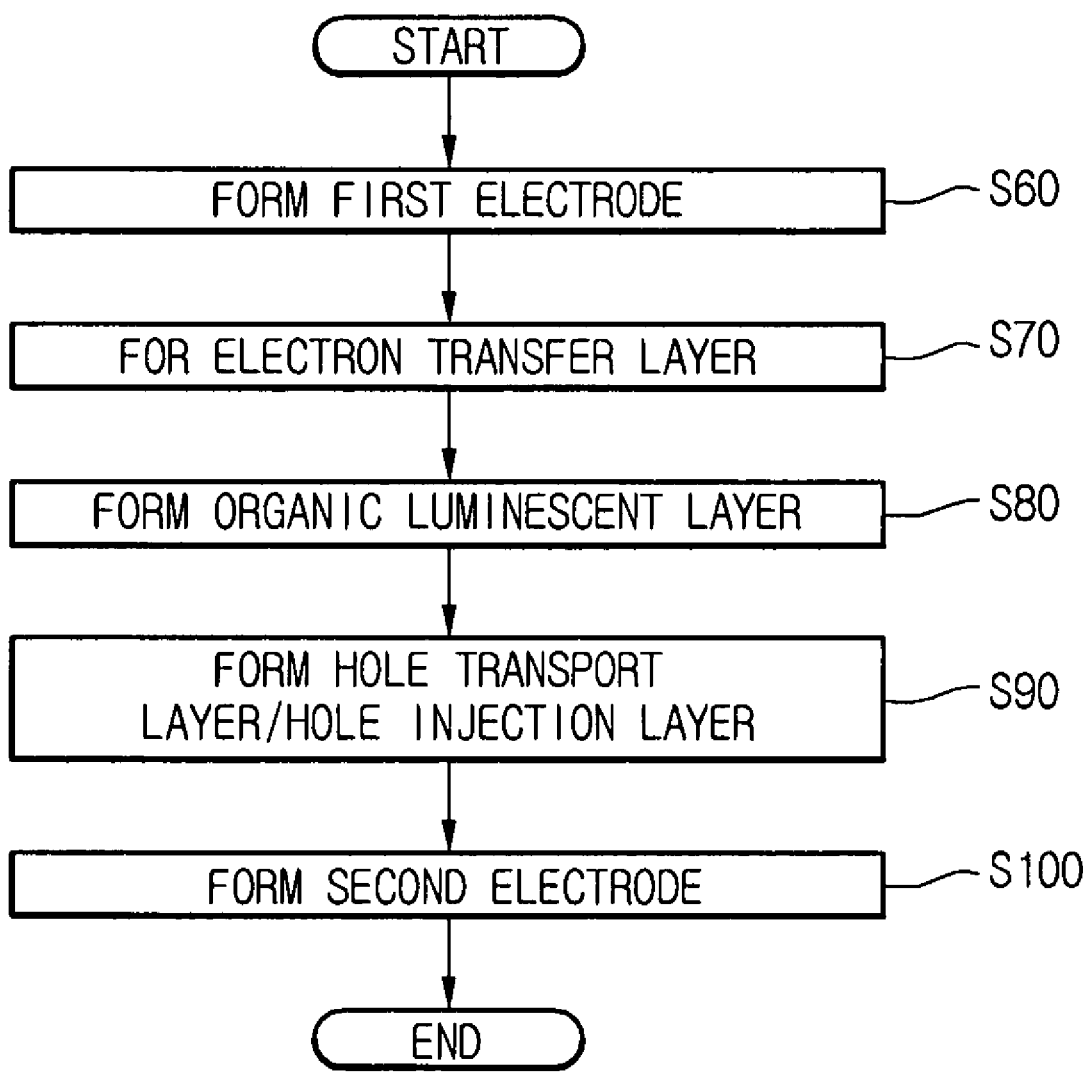
FIG. 8B is a flowchart of a method of manufacturing an organic light emitting device according to a fourth embodiment of the present invention.

FIG. 8B is a flowchart of a manufacturing method of an organic light emitting device according to a fourth embodiment of the present invention. Referring to FIGS. 1, 5 and 8B, the manufacturing method of the organic light emitting device according to the fourth embodiment will now be described. In steps S60 and S70, a second electrode 32 is formed of a conductive metal, such as aluminum, or aluminum alloy, and then an electron transfer layer 33(43) is formed on the second electrode 32. As described with reference to FIG. 8A, referring to FIGS. 3 and 6, the electron transfer layer 33(43) includes a plurality of electron transfer members 33c(43c). The electron transfer members 33c(43c) include respective single-crystal silicon particles 33b(43b) formed using powder type silicon particles or formed by UV polymerization reactions, and an insulating layer 33a(43a) that is used to coat the single-crystal silicon particles 33b (43b) or is deposited on the single-crystal silicon particles 33b(43b). The insulating layer 33a(43a) is formed of one of silicon nitride (SiNx), silicon oxide (SiOx) and an organic insulating material.

The single-layered electron transfer layer 33(43), including the electron transfer members 33c(43c) having the single-crystal silicon particles 33b(43b) coated with the insulating layer 33a(43a) or the insulating layer 33a(43a) deposited thereon, transports electrons provided from the second electrode 32 efficiently to an organic luminescent layer 35 to be described later. The electron transfer layer 33(43) is formed by mixing powder type single-crystal silicon particles with a solvent or a volatile solution, forming a resulting mixture on the second electrode 32, and then forming the insulating layer 33a(43a) thereon. Alternatively, the electron transfer layer 33(43) is formed by forming on the second electrode 32 single-crystal silicon particles into a thin film type using a UV polymerization reaction, and then forming the insulating layer 33a(43a) thereon.

The insulating layer 33a(43a) is formed by coating or depositing a silicon oxide layer or a silicon nitride layer, thereby forming the electron transfer member 33c, as illustrated in FIG. 3, or forming the electron transfer member 43c, as illustrated in FIG. 6. When the insulating layer 33a is formed by a coating process after the single-crystal silicon particles 33b are formed on the second electrode 32, the electron transfer members of FIG. 3 are formed. When the insulating layer 43a is formed by a deposition process, the electron transfer members 43c of FIG. 6 are formed. Also, an application and solvent-removing process of applying a mixture, including the electron transfer members 33c(43c), on the second electrode 32 and forming a preliminary electron transfer layer 33(43) includes a dry process using a heat treatment. The thickness of the electron transfer layer 33(43) can range from about 300 Å to 600 Å.

When the electron transfer layer is formed in the above manner, an organic luminescent layer 35 is formed on the electron transfer layer in step S80. The organic luminescent layer 35 can be formed by vacuum deposition or spin-coating. In the current embodiment, the organic luminescent layer 35 can include a polymer material that can generate red light, green light and blue light by combination of holes provided through a hole injection layer 36 and a hole transport layer 37 to be described later, and electrons transported by the electron transfer layer.

In steps S90 and S100, when the organic luminescent layer 35 is formed, the hole transport layer 37 and the hole injection layer 36 are sequentially formed, and a first electrode 31 is formed on the hole injection layer 36. A substrate 20 formed of a transparent insulating material is formed on the first electrode 31.

Figure 9:
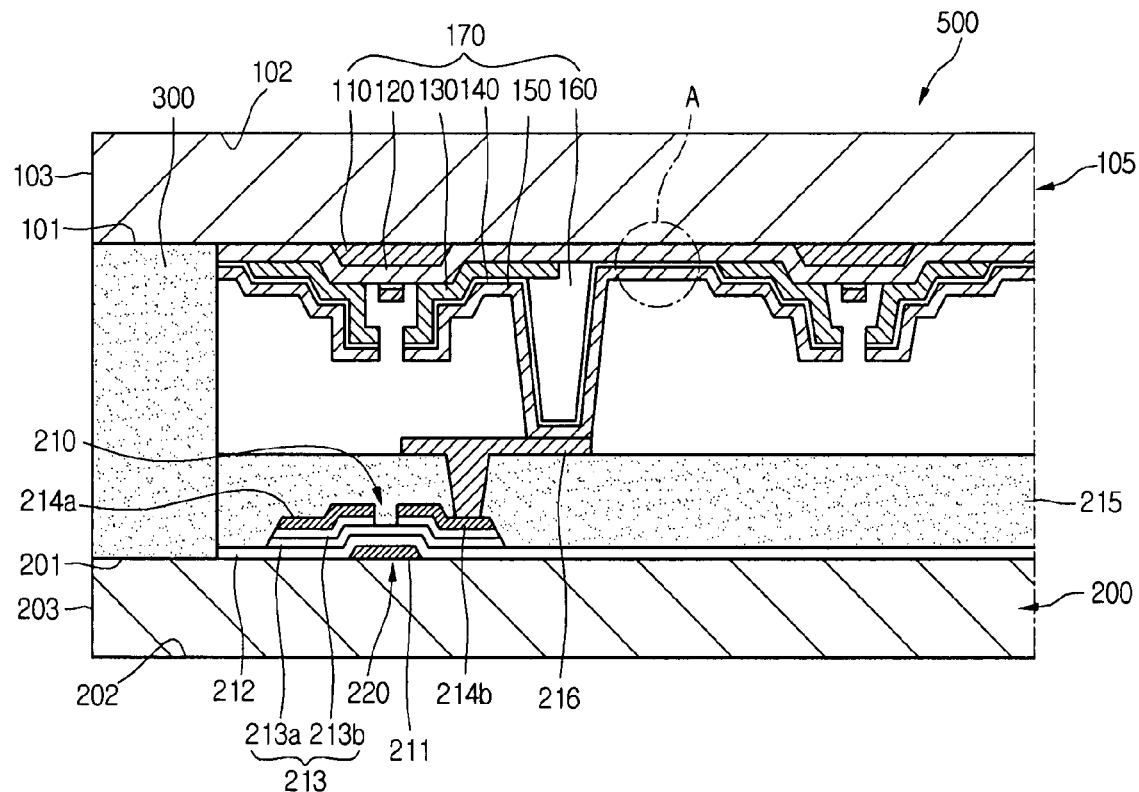
FIG. 9 is a cross-sectional view illustrating an organic light emitting device according to a fifth embodiment of the present invention.
Figure 10A:
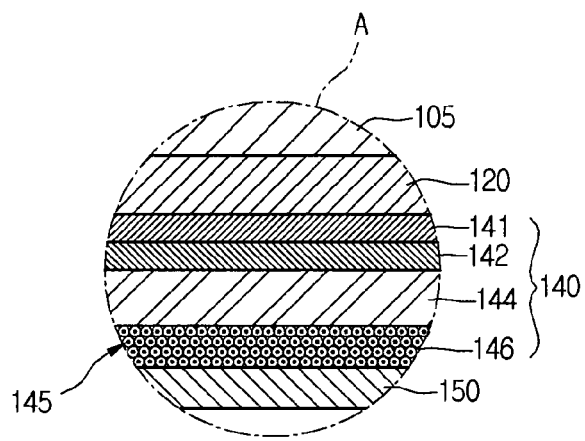
FIGS. 10A and 10B are partial enlarged views of part A of FIG. 9.
Figure 10B:
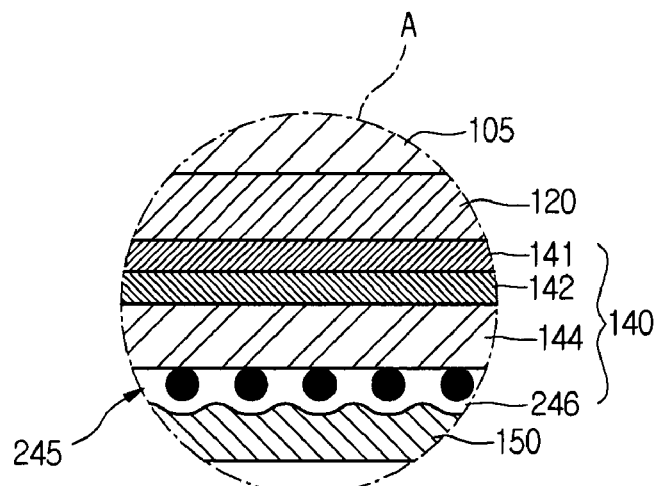

FIG. 9 is a cross-sectional view illustrating an organic light emitting device according to a fifth embodiment of the present invention, and FIGS. 10A and 10B are enlarged views of part "A" of FIG. 9. Referring to FIGS. 9 and 10, an organic light emitting device 500 includes a first substrate 105, a second substrate 200, and an encapsulating member 300.

The first substrate 105 can be a transparent substrate having substantially the same light transmittance as that of glass. The first substrate 105 can be a glass substrate. The first substrate 105 includes a first surface 101 facing the second substrate 200, a second surface 102 facing the first surface 101, and side surfaces 103 connecting the first and second surfaces 101 and 102.

The second substrate 200 can be, for example, a transparent substrate having substantially the same light transmittance as that of glass. Alternatively, the second substrate 200 can be an opaque substrate. The second substrate 200 includes a third surface 201 facing the first surface 101, a fourth surface 202 facing the third surface 201, and side surfaces 203 connecting the third and fourth surfaces 201 and 202.

A display device 170 is disposed on the first surface 101 of the first substrate 105. The display device 107 includes an auxiliary electrode pattern 110, a first electrode 120, partition wall patterns 130, organic light emitting patterns 140, a second electrode 150, and a spacer 160.

The auxiliary electron pattern 110 is disposed on the first surface 101 of the first substrate 105. When viewed from the plane, the auxiliary electrode pattern 110 has a lattice shape. Examples of a material used for the auxiliary electrode pattern 110 can include molybdenum, aluminum, copper, and chrome. The auxiliary electrode pattern 110 serves to reduce electrical resistance of the first electrode 120 to be described later.

The first electrode 120 is disposed on the first surface 101 of the first substrate 105, and covers the auxiliary electrode pattern 110. In the current embodiment, examples of a material used for the first electrode 120 can include indium tin oxide (ITO), indium zinc oxide (IZO), and amorphous indium tin oxide (a-ITO).

The partition wall patterns 130 are disposed on the first electrode 120, and form a pixel area on the first electrode 120. The number of partition wall patterns 130 corresponds to a resolution of the organic light emitting device 500. The partition wall patterns 130 are spaced apart from each other at a predetermined interval, and have a quadrangular frame shape having therein an opening exposing the first electrode 120.

The spacer 160 is disposed on the first electrode 120. Alternatively, a portion of the spacer 160 can overlap the partition wall pattern 130. The spacer 160 is formed in each pixel area defined by the partition wall patterns 130. The spacer 160 can have, for example, a column shape. The height of the spacer 160 measured from a surface of the first electrode 120 is greater than the height of the partition wall pattern 130 measured from a surface of the first electrode 120.

The organic light emitting patterns 140 are disposed on the first electrode 120 exposed by the partition wall patterns 130, and on the partition wall patterns 130 by self-alignment.

Referring to FIGS. 10A and 10B, the organic light emitting pattern 140 formed on the first electrode 120 can include a hole injection layer 141, a hole transport layer 142, an organic luminescent layer 144, and an electron transfer layer 146 (246). The hole transport layer 142 is disposed on the hole injection layer 141. The hole transport layer 142 efficiently transports holes provided from the first electrode 120 and the hole injection layer 141 to the organic luminescent layer 144.

The organic luminescent layer 144 can be disposed on the hole injection layer 141. Alternatively, the organic luminescent layer 144 can be disposed directly on the first electrode. As the organic luminescent layer 144, various polymer materials suitable to generate red, green and blue light can be used.

The electron transfer layer 146(246) is interposed between a second electrode 150 to be described later, and the organic luminescent layer 144.

Referring to FIGS. 10A and 10B, the electron transfer layer 146(246) has a single-layered structure, and the single-layered electron transfer layer 146(246) serves as an electron injection layer and an electron transport layer. That is, the electron transfer layer 146(246) injects and transports electrons from the second electrode 150 to be described later to the organic luminescent layer 144.

The electron transfer layer 146(246) includes a plurality of electron transfer members 145(245) to inject and transport electrons from the second electrode 150 to the organic luminescent layer 144. The electron transfer members 145(245) include respective single-crystal silicon particles and an insulating layer coating the single-crystal silicon particles. The single-crystal silicon particle can have a diameter ranging from about 50 Å to 100 Å. Also, the insulating layer used to coat the single-crystal silicon particles can be, for example, a silicon nitride layer or a silicon oxide layer.

As described above, the single-crystal silicon particles are prepared by mixing powder type single-crystal silicon particles with a solvent or a volatile solution or by radiating UV rays to a mixture including single-crystal silicon particles to cause a polymerization reaction. FIG. 10A is a view of the case where the single-crystal silicon particles prepared in the above manner are coated with an insulating layer, and FIG. 10B is a view of forming single-crystal silicon particles and depositing an insulating layer thereon. The electron transfer layer 146(246), including the electron transfer members 145 (245), is disposed with a uniform thickness between the second electrode 150 and the organic luminescent layer 144.

In the current embodiment, the thickness of the electron transfer layer 146(246), including the electron transfer members 145(245), measured between the organic luminescent layer 144 and the second electrode can be in range about 300 Å to about 600 Å. If the thickness of the electron transfer layer 146(246) is smaller than about 300 Å, the number of electrons transported to the organic luminescent layer 144 through the electron transfer layer 146(246) can greatly decrease relative to the number of holes. In contrast, if the thickness of the electron transfer layer 146(246) is greater than about 600 Å, the number of electrons transported to the organic luminescent layer 144 through the electron transfer layer 146(246) can greatly increase relative to the number of holes. Also, if the thickness of the electron transfer layer 144 is greater than about 600 Å, the entire thickness of the organic light emitting device 500 can increase.

The second electrode 150 is disposed on the electron transfer layer 146(246). The second electrode 150 transfers electrons to the organic luminescent layer 144. Electrons provided from the second electrode 150, and holes provided from the first electrode 120 allows the organic luminescent layer 144 to generate red light, green light, and blue light depending on a polymer material of the organic luminescent layer 144. The second electrode 150 can be formed of a material with a low work function, and examples of the material of the second electrode 150 include aluminum and aluminum alloy.

Referring to FIG. 9 again, a driving device 210 is disposed on the third surface 201 of the second substrate 200 to drive the display device 170 disposed on the first surface 101 of the first substrate 105. To drive the display device 170, the driving device 210 can include, for example, two thin film transistors 220 and one capacitor (not shown). Each of the thin film transistors 220 includes a gate electrode 211, a gate insulating layer 212, a channel layer 213, a source electrode 214a and a drain electrode 214b. The gate electrode 211 is electrically connected to a gate line (not shown) disposed on the third surface 201, and a timing signal is applied to the gate electrode 211. The gate insulating layer 212 insulates the gate electrode 211 and the gate line. The gate insulating layer 212 can be an oxide layer or a nitride layer. The channel layer 213 is disposed on the gate insulating layer 212. The channel layer 213 faces the gate electrode 211 covered with the gate insulating layer 212.

The channel layer 213 includes an amorphous silicon pattern 213, and n+ amorphous silicon patterns 213b. The amorphous silicon pattern 213a is disposed on the gate insulating layer 212, and the n+ amorphous silicon patterns 213 are disposed on the amorphous silicon pattern 213a. A pair of amorphous silicon patterns 213b are disposed on the amorphous silicon pattern 213b, and the amorphous silicon patterns 213b are spaced apart from each other.

The source electrode 214a is electrically connected to any one of the n+ amorphous silicon patterns 213b, and the drain electrode 214b is electrically connected to the remaining n+ amorphous silicon pattern 213b.

The thin film transistor 220 is insulated by an organic layer pattern 215 including a contact hole exposing the drain electrode 214b, and the drain electrode 214b of the thin film transistor 220 is electrically connected to a connection pattern 216.

The second electrode 150 of the display device 170 formed on the first substrate is electrically connected to the connection pattern 216 of the thin film transistor 220 of the driving unit 210 formed on the second substrate 200.

When viewed from the plane, the encapsulating member 300 can have a closed loop shape along an edge of the first substrate 105 and/or the second substrate 200. For the physical coupling between the first and second substrates 100 and 200, the encapsulating member 300 can include a thermosetting material hardened by heat, and a photocurable material hardened by light, such as UV light. Also, the encapsulating member 300 can include a degradation preventing material that prevents the display device 170 from being degraded due to coupling of the encapsulating member 300 with oxygen and/or moisture penetrating from the outside. The degradation preventing material can include an alkali-based metal oxide or an alkali-based metal.

Figure 11:
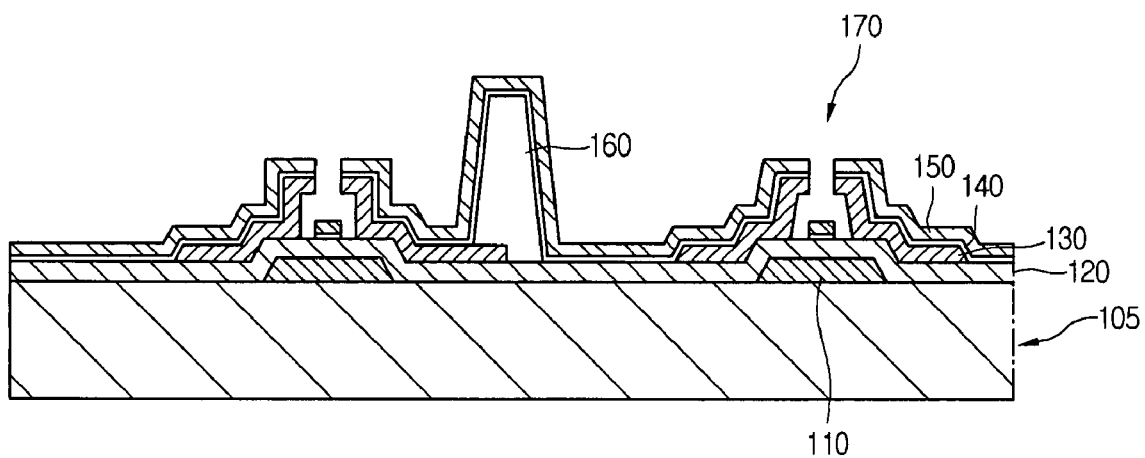
FIGS. 11 and 12 are cross-sectional views for describing a method of manufacturing the organic light emitting device according to the fifth embodiment of the present invention.
Figure 12:
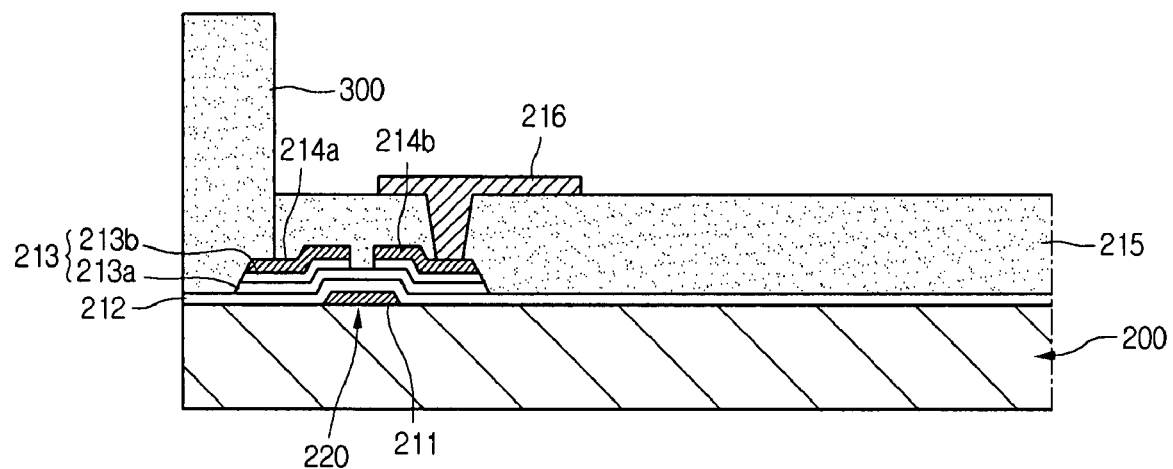

FIGS. 11 and 12 are cross-sectional views for describing a manufacturing method of an organic light emitting device according to the fifth embodiment of the present invention. Referring to FIG. 11, an auxiliary electrode pattern 110 is formed on a first substrate 105. In the current embodiment, the auxiliary electrode pattern 110 has a lattice shape when viewed from the plane. The auxiliary electrode pattern 110 serves to reduce electrical resistance of a first electrode 120 to be described later. The auxiliary electrode pattern 110 can be formed of, for example, molybdenum, aluminum, cooper, or chrome.

After the auxiliary electrode pattern 110 is formed on the first substrate 105, then the first electrode 120 covering the auxiliary electrode pattern 110 is formed on the first substrate 105.

After the first electrode 120 is formed, an organic sacrificial layer pattern (not shown) including a photoresist material is formed on the first electrode 120 facing the auxiliary electrode pattern 110. Since the auxiliary electrode pattern 110 has a lattice shape, the organic sacrificial layer pattern also has a lattice shape when viewed from the plane.

After the organic sacrificial layer pattern is formed, an inorganic layer (not shown) covering the first electrode 120 and the organic sacrificial layer pattern is formed.

Thereafter, the inorganic layer is patterned to form partition wall patterns 130 on the first electrode 120. The partition wall patterns 130 have a quadrangular frame shape. Adjacent partition wall patterns 130 expose an upper surface of the organic sacrificial layer pattern.

After the partition wall patterns 130 exposing an upper surface of the organic sacrificial layer pattern is formed, the organic sacrificial pattern is removed from the first electrode 120 by an etchant or an etching gas.

After the organic sacrificial layer pattern is removed from the first electrode 120, a spacer 160 with a column shape is formed on the first electrode 120. The spacer 160 can be formed on the first electrode 120 or the partition wall pattern 130 by patterning an organic layer.

Thereafter, as illustrated in FIGS. 10A and 10B, a hole injection hole 141, a hole transport layer 142, and an organic luminescent layer 144 are sequentially formed on an entire surface of the first substrate. The hole injection layer 141, the hole transport layer 142, and the organic luminescent layer 144 can be formed by a vacuum deposition method. The organic luminescent layer 144 can include a polymer material that can generate red light, green light and blue light by combination of holes provided through the hole injection layer 141 and the hole transport layer 142, and electrons transported by an electron transfer layer 146(246) to be described later.

The electron transfer layer 146(246) is formed on the organic luminescent layer 144. The electron transfer layer 146(246) includes a plurality of electron transfer members 145(245). The electron transfer members 145(245) include respective single-crystal silicon particles of a powder type, and an insulating layer coating each of the single-crystal silicon particles. The single-layered electron transfer layer 146(246), including the electron transfer members 145(245) having the single-crystal silicon particles 145a coated with the insulating layer efficiently transfers electrons provided from a second electrode 150 to be described later to the organic luminescent layer 144. An application process and a dry process are performed. In the application process, a mixture obtained by mixing the electron transfer members 145(245) with a binder dissolved in a solvent and having adhesiveness and volatility is applied on the organic luminescent layer 144 to form a preliminary electron transfer layer. In the dry process, the solvent of the binder is removed. The mixture, including the binder and the electron transfer member 145(245) can be applied on the organic luminescent layer 144 by a silk screen process, a slit-coating process, or a spin-coating process. The thickness of the electron transfer layer 146(246) measured from a surface of the organic luminescent layer 144 can range from about 300 Å to 600 Å.

After the electron transfer layer 146(246) is formed on the organic luminescent layer 144, the second electrode 150 is formed on the electron transfer layer 146(246). The second electrode 150 can be formed of, for example, aluminum, or aluminum alloy. The second electrode 150 provides electrons to the electron transfer layer 146(246).

As illustrated in FIG. 12, a driving device 210 for applying a driving signal for generation of light from the display device 170 on the first substrate 105 is manufactured on the second substrate 200. The driving device 210 includes thin film transistors 220 such as a switching transistor and a driving transistor, and a capacitor (not shown). To form the thin film transistors 220, a gate electrode 211 is formed on the second substrate 200, and a gate insulating layer 212 covering the gate electrode 211 is formed on the gate electrode 211. A channel layer 213 including an amorphous silicon pattern 213a, and a pair of n+amorphous silicon patterns 213b is formed on the gate insulating layer 212. A source electrode 214a is formed on any one of the n+ amorphous silicon pattern 213b, and a drain electrode 214b is formed on the remaining n+ amorphous silicon pattern 213b.

After the driving device 220 is manufactured on the second substrate 200, an organic layer pattern 215 covering the driving device 210 and having an opening exposing the drain electrode 214b of the thin film transistor 220 is formed on the second substrate 200. Thereafter, a connection pattern 216 connected to the drain electrode 214b is formed at the opening of the organic layer pattern, thereby completing the second substrate 200.

After the first substrate 105 including the display device 170, and the second substrate 200 including the driving device 210 are manufactured as illustrated in FIGS. 11 and 12, an encapsulating member 300 is formed at one of the first substrate facing the second substrate 200 and the second substrate 200 facing the first substrate 105. When viewed from the plane, the encapsulating member 300 can have a closed loop shape formed along an edge of the second substrate 200. The encapsulating member 300 can include a thermosetting material hardened by heat, or a photocurable material hardened by light such as UV light. Also, the encapsulating member 300 can include a degradation preventing material that prevents the display device 170 from being degraded due to coupling of the encapsulating member 300 with oxygen and/or moisture penetrating from the outside. The degradation preventing material can include an alkali-based metal oxide or an alkali-based metal.

After the encapsulating member 300 is disposed along the edge of the second substrate 200, the first substrate 105 and the second substrate 200 are coupled by the encapsulating member 300. The second electrode 150 of the first substrate 105 is electrically connected to a connection pattern 216 of the second substrate 200 by the encapsulating member 300. After the second electrode 150 of the first substrate 105, and the connection pattern 216 of the second substrate 200 are electrically connected together, the encapsulating member 300 is hardened by heat or light to make a physical/electrical connection between the first and second substrates 100 and 200, thereby completing the manufacturing of the organic light emitting device.

As so far described in detail, unlike the related art electron transfer layer having a multi-layered structure, the organic light emitting device according to embodiments of the present invention includes the electron transfer layer having a single-layer structure that provides electrons to the organic luminescent layer. The single-layer electron transfer layer includes electron transfer members having single-crystal silicon particles encompassed by an insulating layer. Accordingly, a manufacturing process of the organic light emitting device can be considerably reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic light emitting device comprising:
  a first electrode for providing holes;
  a second electrode facing the first electrode and providing electrons;
  an organic luminescent layer interposed between the first and second electrodes; and
  an electron transfer layer disposed between the second electrode and the organic luminescent layer, wherein the electron transfer layer is a single layer including electron transfer members so that the electron transfer layer injects and transports electrons to the organic luminescent layer while preventing holes from the first electrode from flowing into the electron transfer layer, and wherein the electron transfer members include single-crystal silicon particles.

2. The organic light emitting device according to claim 1, wherein each of the single-crystal silicon particles can have a diameter ranging from about 50 Å to about 100 Å.

3. The organic light emitting device according to claim 1, wherein each of the single-crystal silicon particles is encompassed by an insulating layer.

4. The organic light emitting device according to claim 3, wherein the insulating layer is one of silicon nitride, silicon oxide and an organic insulating layer.

5. The organic light emitting device according to claim 4, wherein each single-crystal silicon particles encompassed within the insulating layer is disposed with a uniform thickness between the second electrode and the organic luminescent layer.

6. The organic light emitting device according to claim 1, wherein the single-crystal silicon particles are in an insulating layer.

7. The organic light emitting device according to claim 6, wherein the insulating layer is one of silicon nitride, silicon oxide and an organic insulating material.

8. The organic light emitting device according to claim 1, wherein a thickness of the electron transfer layer, including the electron transfer members, measured between the organic luminescent layer and the second electrode is within a range of about 300 Å to about 600 Å.

9. A method of manufacturing an organic light emitting device, comprising:
  forming a second electrode on a substrate;
  forming a hole injection layer and a hole transport layer sequentially on the second electrode;
  forming an organic luminescent layer on the hole transport layer;
  forming an electron transfer layer, including a plurality of electron transfer members and an insulating layer, on the organic luminescent layer; and
  forming a first electrode on the electron transfer layer,
  wherein the forming the electron transfer layer includes,
  mixing powder type single-crystal silicon particles with a volatile solution;
  applying a resulting mixture on the organic luminescent layer; and
  forming the insulating layer on the single-crystal silicon particles.

10. The method of manufacturing an organic light emitting device according to claim 9 wherein the forming the insulating layer includes depositing by one of spin coating and printing.

11. The method of manufacturing an organic light emitting device according to claim 9, wherein the applying the resulting mixture includes inkjetting the resulting mixture onto the organic luminescent layer.

12. The method of manufacturing an organic light emitting device according to claim 9, wherein the insulating layer is one of silicon nitride, silicon oxide and an organic insulating material.

13. A method of manufacturing an organic light emitting device, comprising:
  forming a first electrode on a substrate;
  forming an electron transfer layer, including a plurality of electron transfer members and an insulating layer, on the first electrode;
  forming an organic luminescent layer on the electron transfer layer;
  forming a hole transport layer a hole injection layer sequentially on the organic luminescent layer; and
  forming a second electrode on the a hole injection layer,
  wherein the forming the electron transfer layer includes,
  mixing powder type single-crystal silicon particles with one of a solvent and a volatile solution;
  applying a resulting mixture on the first electrode; and
  forming the insulating layer on the single-crystal silicon particles.

14. The method of manufacturing an organic light emitting device according to claim 13, wherein the forming the insulating layer includes depositing by one of spin coating and printing.

15. The method of manufacturing an organic light emitting device according to claim 13, wherein the applying the resulting mixture includes inkjetting the resulting mixture onto the first electrode.

16. The method of manufacturing an organic light emitting device according to claim 13, wherein the insulating layer is one of silicon nitride, silicon oxide and an organic insulating material.

17. An organic light emitting device comprising:
  a first substrate having a display device including:
  a first electrode on the first substrate for providing holes;
  a second electrode facing the first electrode and providing electrons;
  an organic luminescent layer interposed between the first and second electrodes; and
  an electron transfer layer disposed between the second electrode and the organic luminescent layer,
  wherein the electron transfer layer is a single layer including single-crystal silicon particles so that the electron transfer layer injects and transports electrons to the organic luminescent layer while preventing holes from the first electrode from flowing into the electron transfer layer;
  a second substrate having a driving device; and
  an encapsulating member joining the first and second substrate.

18. The organic light emitting device according to claim 17, wherein the single-crystal silicon particles are in an insulating layer.

19. The organic light emitting device according to claim 17, wherein each of the single-crystal silicon particles is encompasses by an insulating layer.

* * * * *